(12) United States Patent
Pu et al.

(10) Patent No.: US 12,159,792 B2
(45) Date of Patent: Dec. 3, 2024

(54) FLIP CHIP PACKAGE UNIT COMPRISING THERMAL PROTECTION FILM AND ASSOCIATED PACKAGING METHOD

(71) Applicant: Chengdu Monolithic Power Systems Co., Ltd., Chengdu (CN)

(72) Inventors: Yingjiang Pu, Chengdu (CN); Hunt Hang Jiang, Saratoga, CA (US); Xiuhong Guo, Chengdu (CN)

(73) Assignee: Chengdu Monolithic Power Systems Co., Ltd., Sichuan (CN)

( * ) Notice: Subject to any disclaimer, the term of this patent is extended or adjusted under 35 U.S.C. 154(b) by 299 days.

(21) Appl. No.: 17/717,257

(22) Filed: Apr. 11, 2022

(65) Prior Publication Data

US 2022/0344175 A1    Oct. 27, 2022

(30) Foreign Application Priority Data

Apr. 22, 2021   (CN) .......................... 202110435879.2

(51) Int. Cl.
*H01L 21/56* (2006.01)
*H01L 23/00* (2006.01)
(Continued)

(52) U.S. Cl.
CPC .......... *H01L 21/563* (2013.01); *H01L 21/561* (2013.01); *H01L 23/3121* (2013.01); *H01L 23/3675* (2013.01); *H01L 23/552* (2013.01); *H01L 24/13* (2013.01); *H01L 24/16* (2013.01); *H01L 24/32* (2013.01); *H01L 24/73* (2013.01); *H01L 2224/13147* (2013.01); *H01L 2224/13553* (2013.01); *H01L 2224/16235* (2013.01); *H01L 2224/32225* (2013.01);
(Continued)

(58) Field of Classification Search
CPC ....... H01L 23/522; H01L 24/13; H01L 24/16; H01L 24/32; H01L 24/73; H01L 24/83; H01L 24/81; H01L 24/92; H01L 24/94; H01L 24/97; H01L 21/561; H01L 2224/11; H01L 2924/18161; H01L 2224/95; H01L 21/563; H01L 23/552; H01L 23/49822
USPC ......................................... 257/778; 438/108
See application file for complete search history.

(56) References Cited

U.S. PATENT DOCUMENTS

2010/0140759 A1* 6/2010 Pagaila .................. H01L 24/73
 257/E23.116
2011/0215466 A1* 9/2011 Hsu ......................... H01L 24/81
 257/737

(Continued)

*Primary Examiner* — Didarul A Mazumder
(74) *Attorney, Agent, or Firm* — Perkins Coie LLP

(57) ABSTRACT

A flip chip package unit and associated packaging method. The flip chip package unit may include an integrated circuit ("IC") die having a plurality of metal pillars formed on its first surface and attached to a rewiring substrate with the first surface of the IC die facing to the rewiring substrate, an under-fill material filling gaps between the first surface of the IC die and the rewiring substrate, and a thermal conductive protection film covering or overlaying and directly contacting with the entire second die surface and a first portion of sidewalls of the IC die. The thermal conductive protection film may have good thermal conductivity, uneasy to fall off from the IC die and can provide physical protection, electromagnetic interference protection and effective heat dissipation path to the IC die.

6 Claims, 7 Drawing Sheets

(51) Int. Cl.
　　　*H01L 23/31*　　　(2006.01)
　　　*H01L 23/367*　　(2006.01)
　　　*H01L 23/552*　　(2006.01)

(52) U.S. Cl.
　　　CPC ............... *H01L 2924/1811* (2013.01); *H01L 2924/18161* (2013.01); *H01L 2924/182* (2013.01)

(56) References Cited

U.S. PATENT DOCUMENTS

| | | | | |
|---|---|---|---|---|
| 2013/0068514 | A1* | 3/2013 | Hsu | H01L 24/92 |
| | | | | 438/126 |
| 2014/0215805 | A1* | 8/2014 | Zhang | H05K 13/00 |
| | | | | 249/66.1 |
| 2015/0126134 | A1* | 5/2015 | Lobianco | H01L 23/552 |
| | | | | 361/783 |
| 2016/0073490 | A1* | 3/2016 | Branchevsky | H05K 1/0306 |
| | | | | 361/783 |
| 2018/0026010 | A1* | 1/2018 | Huang | H01L 23/5386 |
| | | | | 257/659 |
| 2020/0058632 | A1* | 2/2020 | Chen | H01L 24/33 |
| 2021/0045231 | A1* | 2/2021 | Branchevsky | H05K 1/115 |

\* cited by examiner

FLIP CHIP PACKAGE UNIT COMPRISING THERMAL PROTECTION FILM AND ASSOCIATED PACKAGING METHOD

CROSS-REFERENCE TO RELATED APPLICATION(S)

This application claims the benefit of CN application No. 202110435879.2 filed on Apr. 22, 2021 and incorporated herein by reference.

TECHNICAL FIELD

This disclosure relates generally to semiconductor devices, and particularly but not exclusively relates to packaging structure for integrated circuit and associated packaging method.

BACKGROUND

One of the integrated circuit packaging methods includes flip chip packaging of semiconductor dies with integrated circuits (IC) formed therein/thereon. For IC dies that need to handle large power, thermal performance is one of the key design specifications that needs to be considered. Currently, flip-chip packaged IC dies are generally wrapped with traditional encapsulation materials such as molding compound. To meet the heat dissipation requirements to the IC dies, existing solution resort to removing the encapsulation materials on back surface of the IC dies. However, the risk of damage during storage or transportation is increased by exposing the back surface of the IC dies.

SUMMARY

In accordance with an embodiment of the present disclosure, a flip chip package unit is disclosed. The flip chip package unit may include an integrated circuit ("IC") die, having a first die surface and a second die surface opposite to the first die surface, and a plurality of metal pillars formed on the first die surface. The flip chip package unit may further include a rewiring substrate, having a first substrate surface and a second substrate surface opposite to the first substrate surface. The IC die may be attached to the rewiring substrate with the first die surface facing to the second substrate surface. An under-fill material may be formed to fill gaps between the first die surface and the rewiring substrate. The flip chip package unit may further include a thermal conductive protection film, covering or overlaying and directly contacting with the entire second die surface and a first portion of sidewalls of the IC die.

In accordance with an embodiment of the present disclosure, a method for manufacturing a flip chip package unit is disclosed. The method may comprise: mounting a wafer on a carrier board, wherein the wafer includes a plurality of integrated circuit ("IC") units formed in/on the wafer and a plurality of metal pillars formed on a top surface of the wafer for each one of the plurality of IC units; and vertically cutting the wafer from its top surface along preset boundaries of each IC unit to singulate the plurality of IC units from each other. Each individualized IC unit becomes an IC die having a first die surface with the plurality of metal pillars on the first die surface and a second die surface opposite to the first die surface. The method may further include removing the carrier board and providing a rewiring substrate having a first substrate surface and a second substrate surface opposite to the first substrate surface, and attaching each IC die to the rewiring substrate with the first die surface of each IC die facing to the second substrate surface of the rewiring substrate. The method may further include applying an under-fill material to fill gaps between the first die surface of each IC die and the second substrate surface of the rewiring substrate to form an under fill material for each IC die. The method may further include forming a thermal conductive protection film to cover or overlay and be in direct contact with the entire second die surface and a first portion of sidewalls of each exposed IC die. The method may further include cutting the packaging structure obtained after forming the thermal conductive protection film into a plurality of independent flip chip package units with each flip chip package unit including at least one IC die.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features. Likewise, the relative sizes of elements illustrated by the drawings may differ from the relative size depicted.

The use of the same reference label in different drawings indicates the same or like components or structures with substantially the same functions for the sake of simplicity.

DETAILED DESCRIPTION

Various embodiments of the present invention will now be described. In the following description, some specific details, such as example device structures, example manufacturing process and manufacturing steps, and example values for the process, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," right," "in," "out," "front," "back," "up," "down, "top," "atop", "bottom," "over," "under," "overlying," "underlying," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner to establish an electrical relationship between the elements that are coupled. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

Figure 1:
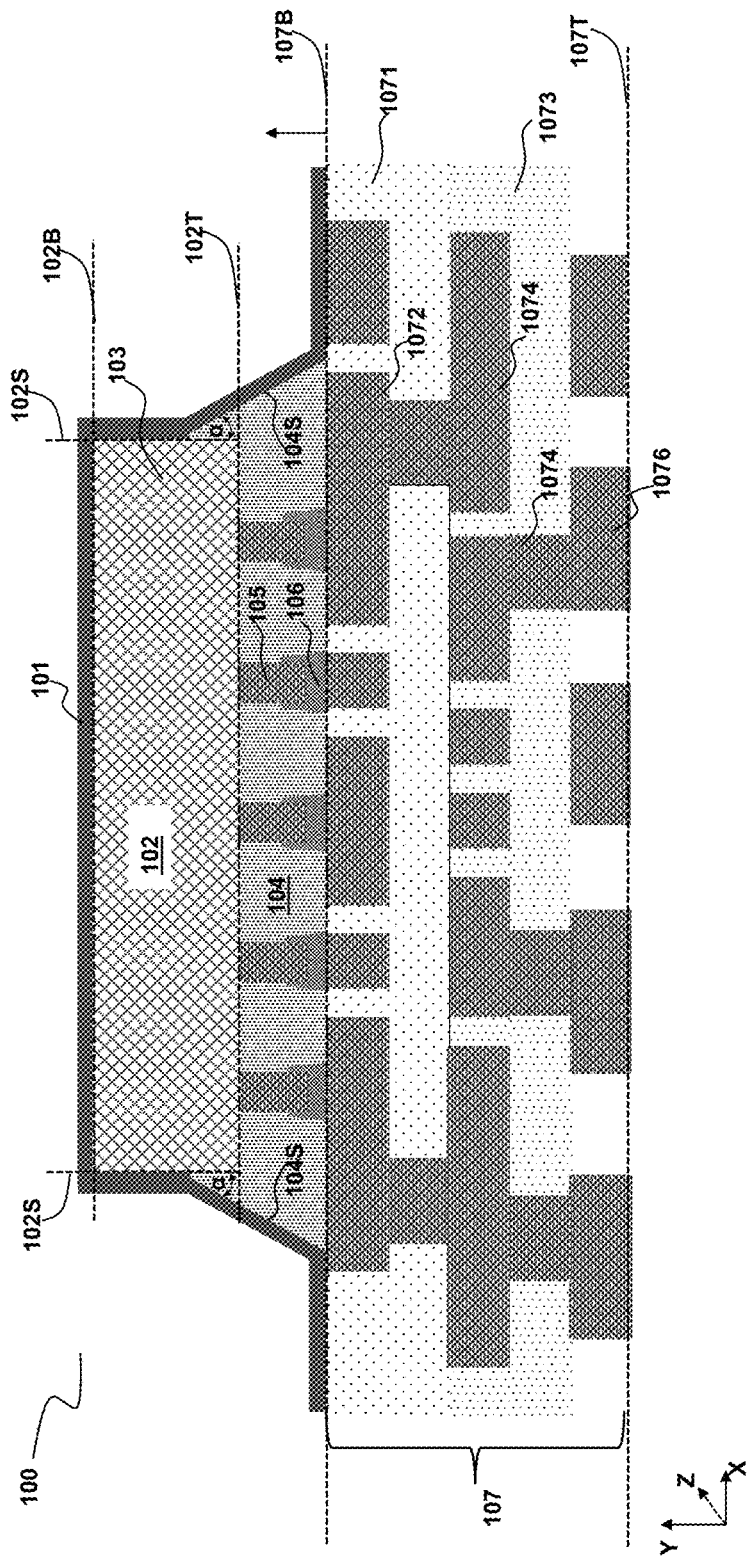
FIG. 1 illustrates a cross-sectional view of a portion of a flip chip package unit 100 in accordance with an embodiment of the present invention.

FIG. 1 illustrates a cross-sectional view of a portion of a flip chip package unit 100 in accordance with an embodiment of the present invention. The cross-section in FIG. 1 may be considered as a partial cross-sectional view as taken from the X-Y plane defined by the X and Y axis in a coordinate defined by X, Y and Z axis perpendicular to each other. In the exemplary embodiment of FIG. 1, the flip chip package unit 100 may comprise at least one IC die 102 packaged therein. In the example of FIG. 1, it is exemplarily illustrated that the flip chip package unit 100 includes one IC die 102. Those skilled in the art should understand that, in other embodiments, the flip chip package unit 100 may include two or more IC dies 102. The number and arrangement pattern or stacking fashion of the IC dies 102 packaged in different flip chip package units 100 can be different. The size of each IC die 102 and the circuit functions implemented can be the same or different, depending on the specific circuit functions to be implemented by a single flip chip package unit 100.

Each IC die 102 may comprise a substrate 103 on or in which integrated circuits are fabricated. Those skilled in the art should understand that the substrate 103 may comprise substrate formed of semiconductor materials such as silicon (Si), compound semiconductor materials such as silicon-germanium (SiGe), or other forms of substrates such as silicon-on-insulator (SOI). Each IC die 102 may have a first surface, for instance referred to as a top surface (labeled with 102T in FIG. 1), and a second surface opposite to the top surface 102T. The second surface may be referred to as a back surface (labeled with 102B in FIG. 1). A plurality of metal pillars (e.g. copper pillars) 105 may be formed on the first surface 102T and may be used to lead out connections/terminals (for instance coupled to active areas including source/emitter regions, drain/collector regions and gate/base regions of transistors etc.) of the integrated circuit(s) fabricated on or in the substrate 103, so that these integrated circuit(s) may be connected or coupled to circuits outside the IC die 102. Each IC die 102 may be referred to as a flip chip die that may be attached (e.g. soldered/welded) to a substrate board or a PCB board with the top surface 102T facing down to interface with the substrate board or the PCB board, and thus may allow electrical coupling and/or signal communication with other external circuits on the substrate board or the PCB board.

In accordance with an exemplary embodiment, the flip chip package unit 100 may further comprise a rewiring substrate 107 having a first surface 107T and a second surface 107B opposite to the first surface 107T. Each IC die 102 may be attached to (e.g. soldered to or welded to) the rewiring substrate 107 with the top surface 102T of each IC die 102 facing to the second surface 107B of the rewiring substrate 107. For instance, the plurality of metal pillars 105 of each IC die 102 may be soldered to the second surface 107B of the rewiring substrate 107 through solder paste 106 to allow the IC die 102 to be electrically coupled to external circuits or for signal communication. The rewiring substrate 107 may comprise one or more interlayer dielectric layer(s) and one or more redistribution metal layer(s). For example, referring to the example illustrated in FIG. 1, the rewiring substrate 107 may include at least one redistribution metal layer (e.g. a first redistribution metal layer 1072 shown in FIG. 1) corresponding to each IC die 102 and coupled to the plurality of metal pillars 105 of each IC die 102. In the example of FIG. 1, the at least one redistribution metal layer may include the first redistribution metal layer 107 that passes/extends through a first interlayer dielectric layer 1071 and is electrically connected to the plurality of metal pillars 105. In some embodiments, the at least one redistribution metal layer may further include, for example, a second redistribution metal layer 1074, which passes/extends through a second interlayer dielectric layer 1073 to electrically connect to the first redistribution metal layer 1072. In some embodiments, the at least one redistribution metal layer may further include, for example, a third redistribution metal layer 1076 electrically connected to the second redistribution metal layer 1074. Those skilled in the art should understand that the first interlayer dielectric layer 1071 and the second interlayer dielectric layer 1073 may include the same dielectric material, or may include different dielectric materials. The rewiring substrate 107 described here is just for example and not intended to be limiting.

In accordance with an exemplary embodiment, an under-fill material 104 may be applied to fill gaps between the first surface 102T of each IC die 102 and the rewiring substrate 107. The under-fill material 104 may use insulating materials having higher fluidity, filling performance and stability than traditional plastic packaging materials (e.g. epoxy molding plastics, etc.), such as NAMICS 8410-302, LOCTITE ECCOBOND UF 8830S, etc. In one embodiment, the under-fill material 104 may only fill the gaps between the plurality of metal pillars (e.g., copper columns) 105 (including corresponding solder pastes 106) on the first surface 102T of each IC die 102 to protect the plurality of metal pillars 105. In one embodiment, the under-fill material 104 may further climb vertically to cover/surround a portion of the sidewalls 102S of each IC die 102. Vertically refers to the direction parallel to the Y-axis. Therefore, a large portion of the sidewalls 102S of each IC die 102 and its second surface 102B remain not wrapped/covered by the under-fill material 104, thereby contributing to better heat dissipation. In one embodiment, the under-fill material 104 protrudes outwards in a ladder shape from each sidewall 102S of each IC die 102, and a side surface 104S of the under-fill material 104 intersects with each sidewall 102S of each IC die 102 to form an angle α. In one embodiment, the angle α may be greater than 0 degrees and smaller than 90 degrees. In one embodiment, the angle α may be greater than 0 degrees and smaller than 45 degrees. In one embodiment, the angle α may be greater than 0 degrees and smaller than or equal to 30 degrees. In this way, the under-fill material 104 can not only better protect the plurality of metal pillars 105, but also better grasp and hold each IC die 102.

In accordance with an exemplary embodiment, the flip chip package unit 100 may further comprise a thermal conductive protection film 101. The thermal conductive protection film 101 may cover or overlay and be in direct contact with the entire second surface 1026 and a portion of the sidewalls 102S of each exposed IC die 102. In an embodiment, the thermal conductive protection film 101 may cover or overlay and in direct contact with an entire backside surface of the flip chip package unit 100. For instance, in the example of FIG. 1, the entire backside surface of the flip chip package unit 100 may include the second surface 102B and the sidewalls 102S of each IC die 102, the exposed side surface 104S of the under-fill material 104 and portions of the second surface 1076 of the rewiring substrate 107 uncovered by the under-fill material 104. It should be understood that, for the flip chip package unit 100, the side to which the second surface 107B of the rewiring substrate 107 and the back surface 102B of each IC die 102 are facing (for example, the direction indicated by upward arrow in FIG. 1) can be referred to as a back side (indicated with 100B in FIG. 1) of the IC package unit 100.

In accordance with an exemplary embodiment, the thermal conductive protection film 101 may include a thermal conductive material having a thermal conductivity higher than 100 W/(m·K). For instance, in one embodiment, the thermal conductive protection film 101 may be formed by sputtering thermal conductive materials having a thermal conductivity higher than 100 W/(m·K) (e.g. titanium, copper, red copper, or other metals or SUS 304 or other alloys etc.) on the entire backside surface of the flip chip package unit 100. Through the sputtering process, strong molecular bonding forms at the interface between the thermal conductive materials of the thermal conductive protection film 101 and the backside surface of the flip chip package unit 100. And thus, the thermal conductive protection film 101 may be tightly bonded to (not easy to fall off from) the backside surface of the flip chip package unit 100. The thermal conductive protection film 101 may not only help to improve the heat dissipation performance of each IC die 102 in the flip chip package unit 100, but also provide good physical protection and electromagnetic interference ("EMI") protection to each IC die 102. In an embodiment, the thermal conductive protection film 101 may comprise an electrical conductive seed layer and a thin metal layer formed on the electrical conductive seed layer. For instance, in an embodiment, the thermal conductive protection film 101 may be formed by sputtering electrical conductive materials for instance having a thermal conductivity higher than 100 W/(m·K) (e.g. titanium, copper, red copper, or other metals or SUS 304 or other alloys etc.) on the entire backside surface of the flip chip package unit 100 and then electroplating metal materials on the electrical conductive materials. In an alternative embodiment, the thermal conductive protection film 101 may include any other thin film formed of thermal conductive materials having a thermal conductivity higher than 1 W/(m·K), for example thin graphene film etc. In an exemplary embodiment, the thermal conductive protection film 101 may have a thickness ranging from 0.3 µm to 10 µm. In another exemplary embodiment, the thickness of the thermal conductive protection film 101 may range from 0.3 µm to 5 µm for example formed by sputtering. In yet another exemplary embodiment, the thickness of the thermal conductive protection film 101 may range from 0.3 µm to 1 µm for example formed by sputtering. In yet another exemplary embodiment, the thickness of the thermal conductive protection film 101 may range from 0.5 µm to 5 µm for example formed by sputtering. In yet another exemplary embodiment, the thickness of the thermal conductive protection film 101 may range from 2 µm to 5 µm for example formed by sputtering and electroplating. In yet another exemplary embodiment, the thickness of the thermal conductive protection film 101 may range from 2 µm to 3 µm for example formed by sputtering and electroplating. In yet another exemplary embodiment, the thickness of the thermal conductive protection film 101 may range from 3 µm to 10 µm for example formed by sputtering and electroplating.

FIG. 2A to FIG. 2F illustrate partial cross-sectional views of some process stages of a wafer level packaging method for manufacturing a flip chip package unit (for example, the flip chip package unit 100 mentioned in the above described embodiments with reference to FIG. 1) in accordance with an embodiment of the present invention.

Figure 2A:
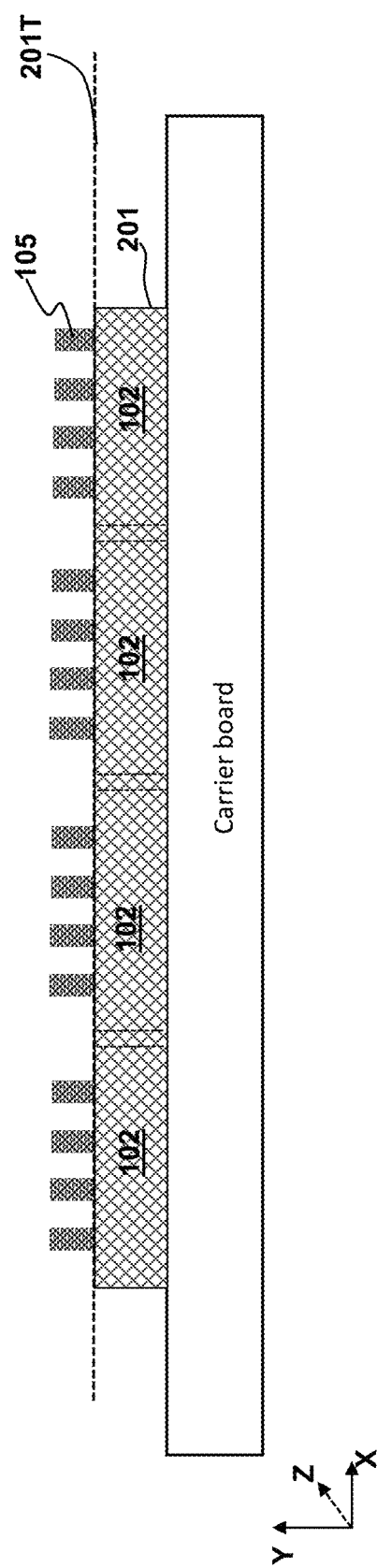
FIG. 2A to FIG. 2F illustrate partial cross-sectional views of some process stages of a wafer level packaging method for manufacturing a flip chip package unit in accordance with an embodiment of the present invention.

Referring to the cross sectional view illustrated in FIG. 2A, in step S1, a wafer 201 with a plurality of integrated circuit units 102 fabricated therein/thereon may be installed/mounted on a carrier board. One of ordinary skill in the art should understand that the shape and size of the carrier board may be reasonably chosen according to the shape, size and number and other parameters of the wafer 201 and this invention is not intended to be limiting in these aspects. In the example in FIG. 2A, the boundaries between the IC units 102 are represented with dashed lines. A plurality of metal pillars (such as copper pillars) 105 for each IC unit 102 may be fabricated on a first surface 201T of the wafer 201.

Figure 2B:
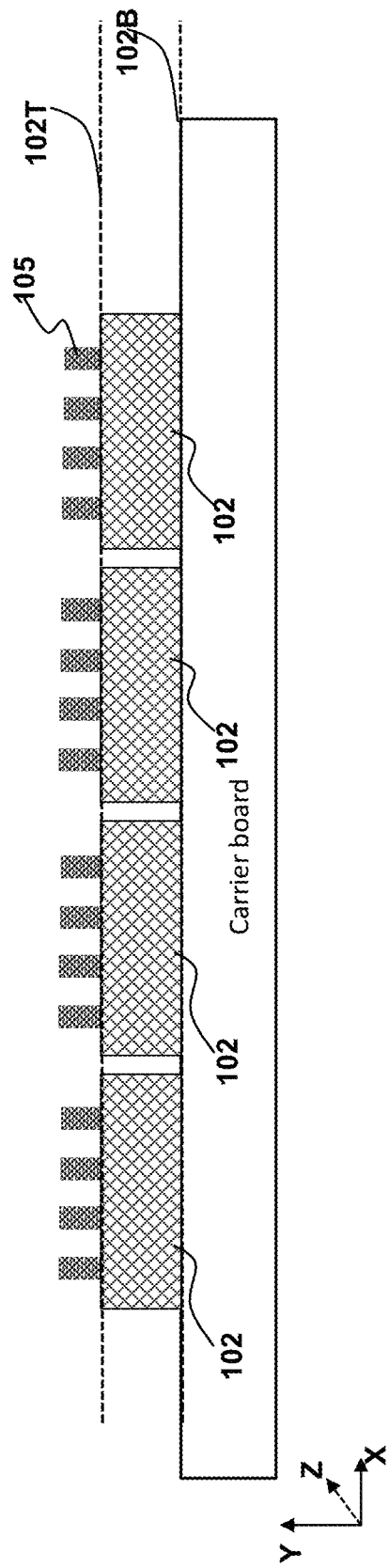

Next, referring to the illustration of FIG. 2B, in step S2, cutting the wafer 201 along the preset boundaries of each IC unit 102 vertically (parallel to the Y-axis) to singulate or separate the IC units 102 from each other. Consequently, a plurality of singulated or individualized IC dies 102 are obtained after the cutting process, with each IC die 102 having a plurality of metal pillars (such as copper pillars) 105 fabricated on its first surface 102T (which may also be referred to as a top surface of the die). Each IC die 102 may include a flip chip die. Each IC die 102 may further have a second surface 102B (that may also be referred to as a back surface of the die) opposite to its first surface 102T.

Figure 2C:
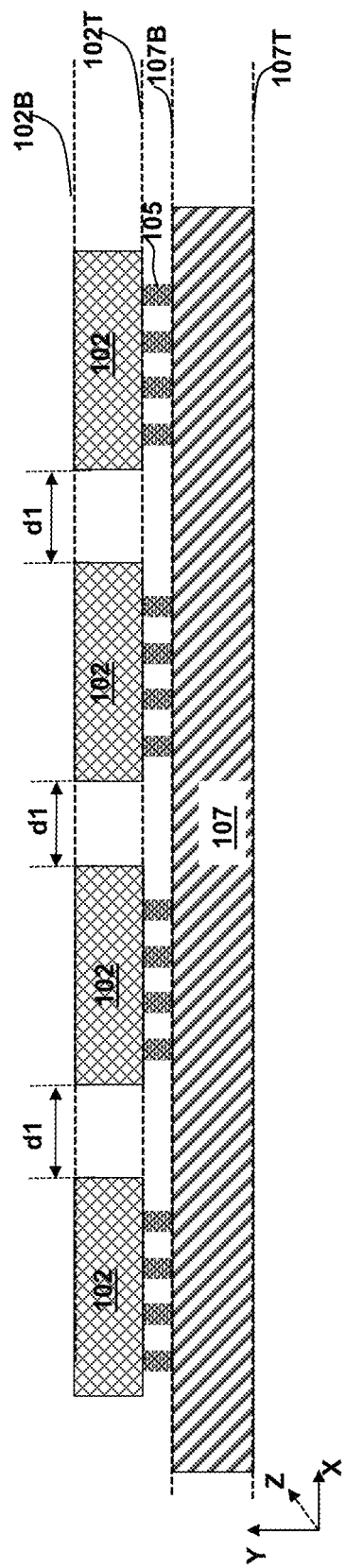

Next, referring to the illustration of FIG. 2C, in step S3, removing the carrier board and providing a rewiring substrate 107, which has a first substrate surface 107T and a second substrate surface 107B opposite to the first substrate surface 107T, and attaching (e.g. by soldering or welding) each IC die 102 to the rewiring substrate 107 with the first surface (top surface) 102T of each IC die 102 facing to the second substrate surface 107B of the rewiring substrate 107. In an embodiment, every two neighboring/adjacent IC dies 102 are spaced or separated from each other with a first lateral distance d1. Lateral may refer to a dimension/measurement along the X-axis. In an embodiment, the rewiring substrate 107 may be prefabricated. Corresponding to each individual IC die 102, the prefabricated rewiring substrate 107 may comprise a plurality of interlayer dielectric layers (e.g. a first interlayer dielectric layer 1071, a second interlayer dielectric layer 1073 etc. as described with reference to the illustration in FIG. 1) and a plurality of redistribution metal layers (e.g. a first redistribution metal layer 1072, a second redistribution metal layer 1074, a third redistribution metal layer 1076, etc. as described with reference to the illustration in FIG. 1). That is to say, for each IC die 102, a plurality of interlayer dielectric layers and a plurality of redistribution metal layers may have been prefabricated in the rewiring substrate 107. Although in the exemplary cross sectional view of FIG. 2C, detailed structure of the rewiring substrate 107 are not illustrated out, one of ordinary skill in the art should understand that the structure may be understood with reference to the illustration in FIG. 1.

Figure 2D:
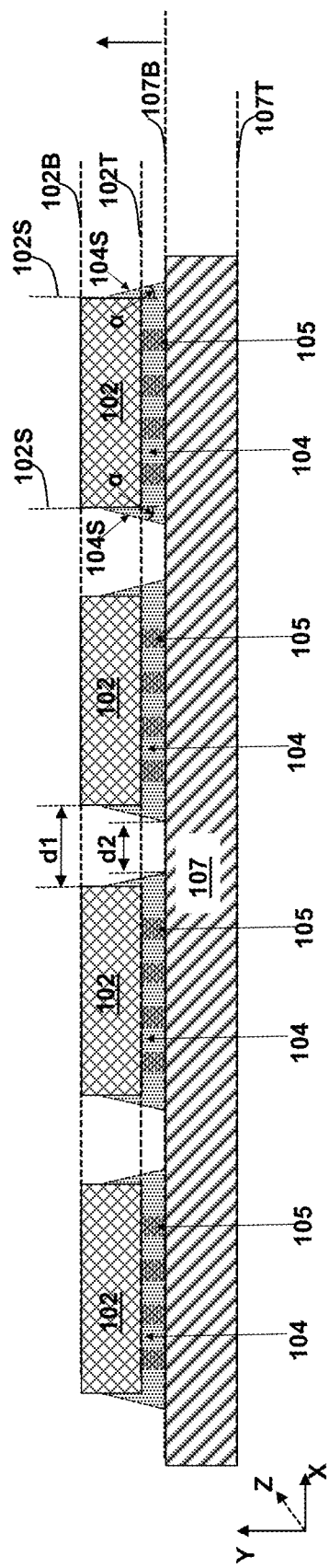

Next, referring to the illustration of FIG. 2D, in step S4, an under-fill material (or a bottom filling material) may be applied (e.g. by injection) to fill gaps between the first surface 102T of each IC die 102 and the second surface 107B of the rewiring substrate 107 to form an under fill material 104 for each IC die 102. In one embodiment, the under-fill material 104 may only fill the gaps between the plurality of metal pillars (e.g., copper columns) 105 (including corresponding solder pastes) on the first surface 102T of each IC die 102 to protect the plurality of metal pillars 105. In one embodiment, during injection of the under-fill material 104, the under-fill material 104 may further climb vertically up to cover/surround a portion of the sidewalls 102S of each IC die 102. Vertically refers to the direction parallel to the Y-axis. In one embodiment, the under-fill material 104 protrudes outward in a ladder shape from each sidewall 102S of each IC die 102, and a side surface 104S of the under-fill material 104 intersects with each sidewall 102S of each IC die 102 to form an angle α. In one embodiment, the angle α may be greater than 0 degrees and smaller than 90 degrees. In one embodiment, the angle α may be greater than 0 degrees and smaller than 45 degrees. In one embodiment, the angle α may be greater than 0 degrees and smaller than or equal to 30 degrees. FIG. 2H illustrates the angle α for one of the IC dies 102 as an example. In one example, each IC die 102 has a second lateral distance d2 between its under-fill material 104 and the under-fill material 104 of an adjacent IC die 102. That is to say, there is the second lateral distance d2 between the under-fill materials 104 of every two adjacent IC dies 102. The second lateral distance d2 is smaller than the first lateral distance d1. The second lateral distance d2 is the shortest distance between two adjacent under-fill materials 104 of every two adjacent IC dies 102 measured parallel to the X-axis direction. In one embodiment, the second lateral distance d2 is greater than 200 µm and smaller than or equal to 5000 µm. In one embodiment, the second lateral distance d2 is greater than 200 µm and smaller than or equal to 3000 µm. In one embodiment, the second lateral distance d2 is greater than 200 µm and smaller than or equal to 1000 µm. In one embodiment, a difference between the first lateral distance d1 and the second lateral distance d2, i.e. (d1-d2), is greater than 200 µm and smaller than or equal to 1000 µm.

Figure 2E:
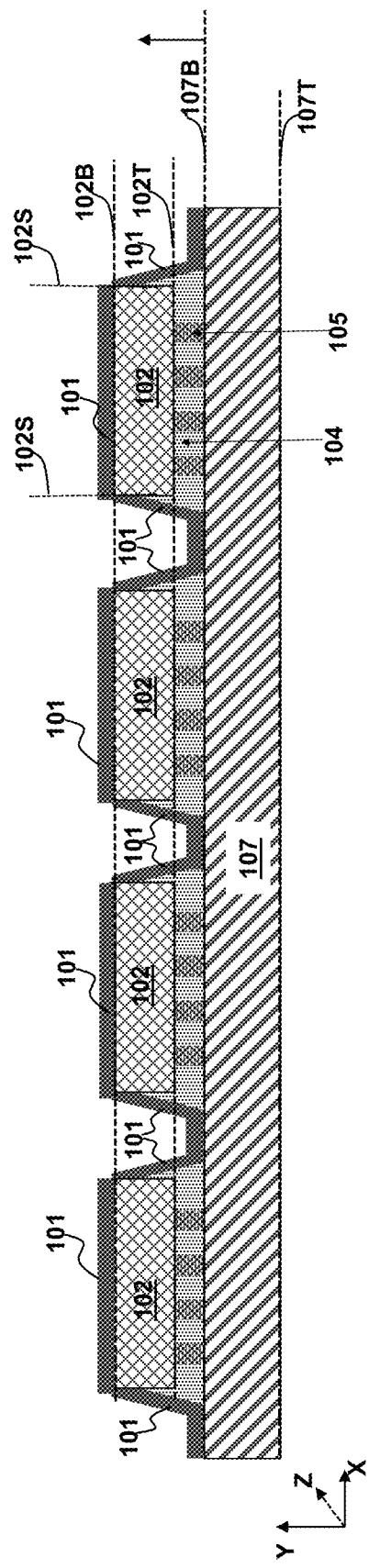

Next, referring to the illustration of FIG. 2E, in step S5, forming a thermal conductive protection film 101 to cover or overlay and be in direct contact with the entire second surface 102B and a portion of the sidewalls 102S of each exposed IC die 102. In an embodiment, the thermal conductive protection film 101 may cover or overlay and in direct contact with an entire backside surface of the package structure obtained after the above step S4 illustrated in FIG. 2D. It should be understood that, for the package structure shown in FIG. 2D, the side to which the second surface 107B of the rewiring substrate 107 and the back surface 102B of each IC die 102 are face (for example, the direction indicated by upward arrow in FIGS. 2D-2E) can be referred to as a back side (e.g. indicated with 1008 in FIG. 1) of the IC package structure. For instance, in the example of FIG. 2D, the entire backside surface of the package structure may include the second surface 102B and the sidewalls 102S of each IC die 102, the exposed side surface 104S of the under-fill material 104 and portions of the second surface 107B of the rewiring substrate 107 uncovered by the under-fill material 104. In accordance with an exemplary embodiment, the thermal conductive protection film 101 may include a thermal conductive material having a thermal conductivity higher than 100 W/(m·K). For instance, in one embodiment, the thermal conductive protection film 101 may be formed by sputtering thermal conductive materials having a thermal conductivity higher than 100 W/(m·K) (e.g. titanium, copper, red copper, or other metals or SUS 304 or other alloys etc.) on the entire backside surface of the package structure obtained after step S4 illustrated in FIG. 2D. In accordance with an alternative exemplary embodiment, the thermal conductive protection film 101 may comprise an electrical conductive seed layer and a thin metal layer formed on the electrical conductive seed layer. For instance, in an embodiment, the thermal conductive protection film 101 may be formed by sputtering electrical conductive materials having a thermal conductivity higher than 100 W/(m·K) (e.g. titanium, copper, red copper, or other metals or SUS 304 or other alloys etc.) on the entire backside surface of the package structure obtained after step S4 illustrated in FIG. 2D and then electroplating metal materials on the electrical conductive materials. In an alternative embodiment, the thermal conductive protection film 101 may include any other thin film formed of thermal conductive materials having a thermal conductivity higher than 1 W/(m·K), for example thin graphene film etc. In an exemplary embodiment, the thermal conductive protection film 101 may be formed to have a thickness ranging from 0.3 µm to 10 µm. In another exemplary embodiment, the thickness of the thermal conductive protection film 101 may range from 0.3 µm to 5 µm. In yet another exemplary embodiment, the thickness of the thermal conductive protection film 101 may range from 0.3 µm to 1 µm. In yet another exemplary embodiment, the thickness of the thermal conductive protection film 101 may range from 0.5 µm to 5 µm. In yet another exemplary embodiment, the thickness of the thermal conductive protection film 101 may range from 2 µm to 5 µm. In yet another exemplary embodiment, the thickness of the thermal conductive protection film 101 may range from 2 µm to 3 µm. In yet another exemplary embodiment, the thickness of the thermal conductive protection film 101 may range from 3 µm to 10 µm.

Figure 2F:
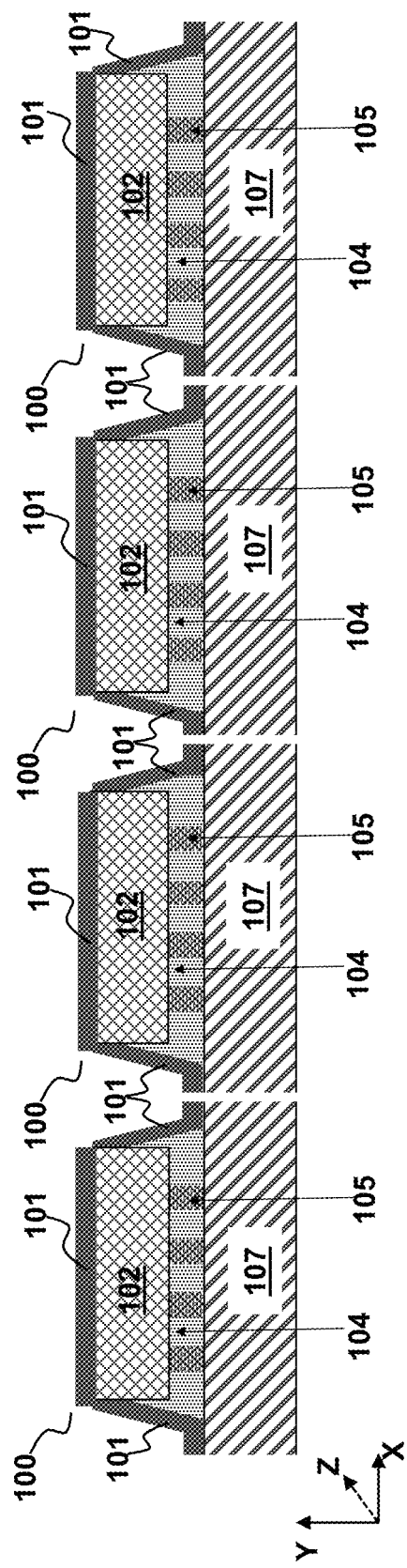

Next, referring to the illustration of FIG. 2F, in step S6, the packaging structure illustrated in FIG. 2E is divided/singulated into a plurality of independent flip chip package units 100 by for example a cutting process. Each flip chip package unit 100 may include at least one IC die 102, and a more detailed description of the structure may be found in the descriptions above with reference to the embodiments shown in FIG. 1. Those of ordinary skill in the art should understand that other process steps may also be included between the above steps S1-S6 as required by the production process, and may not be addressed in more detail to avoid obscuring aspects of embodiments of the present invention.

The present disclosure provides a flip chip package unit and associated wafer level packaging method. Although some of the embodiments of the present disclosure are described in detail, it should be understood that these implementations are for illustrative purposes only and are not intended to limit the scope of the present invention. Other possible alternative implementations may be made by those of ordinary skill in the art by reading this disclosure. Many of the elements of one embodiment may be combined with other embodiments in addition to or in lieu of the elements of the other embodiments. Accordingly, the present invention is not limited except as by the appended claims.

What is claimed is:

1. A method for manufacturing a flip chip package unit, comprising:
   step S1, mounting a wafer on a carrier board, wherein the wafer includes a plurality of integrated circuit ("IC") units formed in/on the wafer and a plurality of metal pillars formed on a top surface of the wafer for each one of the plurality of IC units;
   step S2, vertically cutting the wafer from its top surface along preset boundaries of each IC unit to singulate the plurality of IC units from each other, each individualized IC unit becomes an IC die having a first die surface with the plurality of metal pillars on the first die surface and a second die surface opposite to the first die surface;
   step S3, removing the carrier board and providing a rewiring substrate having a first substrate surface and a second substrate surface opposite to the first substrate surface, and attaching each of the IC die to the rewiring substrate with the first die surface of each of the IC die facing to the second substrate surface of the rewiring substrate;

step S4, applying an under-fill material to fill gaps between the first die surface of each of the IC die and the second substrate surface of the rewiring substrate to form an under-fill material for each of the IC die; and step S5, forming a thermal conductive protection film to cover or overlay and be in direct contact with the entire second die surface and a first portion of sidewalls of each of an exposed IC die.

2. The method of claim 1, wherein in the step S4, the under-fill material further vertically climbs up to cover/surround a second portion of the sidewalls of the IC die.

3. The method of claim 1, wherein in the step S5, the thermal conductive protection film is formed by sputtering thermal conductive materials having a thermal conductivity higher than 100 W/(m·K) on an entire surface at a back side of the package structure obtained after step S4, and wherein the back side of the package structure is the side to which the second substrate surface and the second die surface are facing.

4. The method of claim 1, wherein in the step S5, the thermal conductive protection film is formed by sputtering electrical conductive materials on an entire surface at a back side of the package structure obtained after step S4 and then electroplating metal materials on the electrical conductive materials, and wherein the back side of the package structure is the side to which the second substrate surface and the second die surface are facing.

5. The method of claim 3, wherein the thermal conductive protection film is formed to have a thickness in a range from 0.3 μm to 5 μm.

6. The method of claim 4, wherein the thermal conductive protection film is formed to have a thickness in a range from 2 μm to 5 μm.

* * * * *